United States Patent [19]
Kapoor

[11] Patent Number: 5,583,062
[45] Date of Patent: Dec. 10, 1996

[54] SELF-ALIGNED TWIN WELL PROCESS HAVING A SIO$_2$-POLYSILICON-SIO$_2$ BARRIER MASK

[75] Inventor: Ashok K. Kapoor, Palo Alto, Calif.

[73] Assignee: LSI Logic Corporation, Milpitas, Calif.

[21] Appl. No.: 488,075

[22] Filed: Jun. 7, 1995

[51] Int. Cl.$^6$ .................................................. H01L 21/265
[52] U.S. Cl. .............................. 437/31; 437/56; 437/57; 437/58; 437/89; 437/131
[58] Field of Search .................................. 437/34, 56, 57, 437/58, 89, 131; 257/371, 274, 351

[56] References Cited

U.S. PATENT DOCUMENTS

| | | | |
|---|---|---|---|
| 3,879,619 | 4/1975 | Pleshko | 307/251 |
| 4,373,253 | 2/1983 | Khadder et al. | 29/576 B |
| 4,523,111 | 6/1985 | Baliga | 307/574 |
| 4,527,325 | 7/1985 | Geipel, Jr. et al. | 29/571 |
| 4,558,508 | 12/1985 | Kinney et al. | 29/571 |
| 4,568,842 | 2/1986 | Koike | 307/279 |
| 4,654,548 | 3/1987 | Tanizawa et al. | 307/450 |
| 4,786,958 | 11/1988 | Bhagat | 357/38 |
| 4,816,705 | 3/1989 | Ohba et al. | 307/446 |
| 4,947,064 | 8/1990 | Kim et al. | 307/594 |
| 5,024,961 | 6/1991 | Lee et al. | 437/34 |
| 5,132,241 | 7/1992 | Su | 437/70 |
| 5,160,855 | 11/1992 | Dobberpahl | 307/270 |
| 5,216,294 | 6/1993 | Ryu | 307/443 |
| 5,225,365 | 7/1993 | Cosentino | 437/57 |
| 5,252,501 | 10/1993 | Moslehi | 437/34 |
| 5,256,563 | 10/1993 | Moslehi et al. | 437/56 |
| 5,266,849 | 11/1993 | Kitahara et al. | 307/475 |
| 5,324,683 | 6/1994 | Fitch et al. | 437/65 |

FOREIGN PATENT DOCUMENTS

| | | | |
|---|---|---|---|
| 0138955 | 7/1985 | Japan | 437/56 |
| 62-179113 | 8/1987 | Japan | H01L 21/205 |
| 0179113 | 8/1987 | Japan | 437/131 |
| 092019851A | 6/1992 | WIPO | 437/57 |

OTHER PUBLICATIONS

*VLSI Fabrication Principles, Silicon and Gallium Arsenide*, Sorab K. Ghandhi, Rensselaer Polytechnic Institute, John Wiley & Sons, 1983, pp. 392–394.

Sorab Ghandhi, "VLSI Fabrication Principles", John Wiley & Sons, Inc. pp. 392–394, 1983.

*Primary Examiner*—George Fourson
*Assistant Examiner*—Long Pham
*Attorney, Agent, or Firm*—Fenwick & West LLP; Leo Novakoski; Christopher M. Tobin

[57] ABSTRACT

A method is provided for forming planar, self aligned wells without a high temperature oxidation step to form an ion barrier. The method comprises preparing a substrate with a silicon dioxide-polysilicon-silicon dioxide barrier layer that can be etched to expose different sublayers of the barrier at selected junctures in the production process. A single masking step defines the location of a first set of wells on the prepared substrate. The outer silicon dioxide layer is etched to expose the polysilicon layer at the selected locations, and the substrate is implanted with boron ions to form the first set of wells. Following ion implantation, the substrate photoresist is removed, and the substrate is exposed to a germanium-silicon mixture under conditions selected to preferentially deposit a germanium-silicon alloy barrier layer on the exposed polysilicon layer. The germanium-silicon alloy masks the first set of doped wells against subsequent etching and an ion implantation step that forms the second set of doped wells. Since the locations at which the germanium-silicon alloy deposits are defined by the locations of the first set of wells, the second set of wells is automatically aligned with respect to the first set of wells.

8 Claims, 3 Drawing Sheets

5,583,062

SELF-ALIGNED TWIN WELL PROCESS HAVING A SIO$_2$-POLYSILICON-SIO$_2$ BARRIER MASK

BACKGROUND OF THE INVENTION

1. Technical Field

This invention relates to the field of methods for processing semiconductor materials, and in particular to methods for forming self-aligned wells of P and N type semiconductor materials using a single photo-resist masking step.

2. Background Art

Many semiconductor fabrication process employ steps that produce self-aligned wells in which dopant wells having complementary conductivity properties are placed adjacent to each other. For example, the N and P tubs of CMOS devices are often fabricated using a process that produces self aligned wells. The adjacent wells produced by these processes reduce the amount of semiconductor "real estate" occupied by the corresponding device. In addition, the use of self-aligned well processes eliminates the need to mask the semiconductor wafer with a photo-resist for each ion implantation step.

In place of a second photo-resist mask, conventional self-aligned processes employ a thick oxide layer to mask the semiconductor wafer for ion implantation of the second well. Growth of the thick oxide layer requires elevated temperatures which cause unwanted diffusion of implanted species in the semiconductor wafer. In addition, the thick oxide layers disrupt the planarity of the semiconductor wafer.

There is thus a need for low temperature methods for producing self aligned wells in a semiconductor material without disrupting the planarity of the semiconductor material.

SUMMARY OF THE INVENTION

The present invention is a method for forming self-aligned, doped wells without the need for additional high temperature, oxide generating steps. The present invention employs a barrier layer having a silicon dioxide-polysilicon-silicon dioxide multi-layer structure formed over a semiconductor substrate. Locations of the first set of wells are defined with a photo-resist, and the outer silicon dioxide layer of the multilayer barrier is removed at the selected locations to expose the polysilicon layer. The semiconductor wafer is then implanted with dopant ions to form a set of wells having a first conductivity type at the selected locations. In the preferred embodiment, boron ions are used to implant the first set of wells since they easily penetrate the remaining polysilicon/silicon-dioxide layers of the multi-layer barrier.

Following ion implantation, the photo-resist is removed and the semiconductor wafer is subjected to a chemical vapor deposition (CVD) step with a mixture of germanium and silicon compounds. The CVD conditions are selected to grow a germanium-silicon alloy preferentially on the exposed polysilicon layer over the first set of wells. Substantially no germanium-silicon alloy grows on the exposed silicon dioxide surface, while the germanium-silicon alloy deposited on the polysilicon layer acts as a mask for a subsequent ion-implantation step.

The multi-layer barrier is then selectively etched to remove two or more layers of the unmasked barrier. Ion-implantation with a second type of ion then forms a second set of doped wells adjacent to the areas masked by the germanium-silicon alloy. Since the first and second wells are defined by the boundary of the photo-resist mask, the wells are formed in a self aligned manner. In addition, since oxide layers are not used to mask the substrate against ion implantation, additional high temperature oxide growth steps are eliminated from the process.

DETAILED DESCRIPTION OF THE INVENTION

Figure 1A:
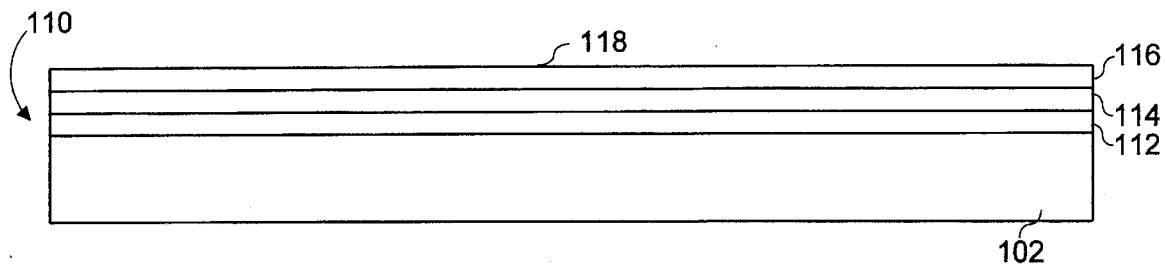
FIGS. 1A–1I are cross-sections of a semiconductor substrate in various stages of processing in accordance with the present invention.

Referring to FIG. 1A there is shown a semiconductor wafer 100 comprising a substrate 102 and a barrier-layer 110 in accordance with the present invention. Barrier layer 110 is a multi-layered structure comprising a first silicon dioxide layer 112, a polysilicon layer 114, and a second silicon dioxide layer 116. Initially, silicon dioxide layer 116 forms an upper surface 118 for semiconductor wafer 100. Barrier layer 110 protects substrate 102 and the multi-layered structure of barrier layer 110 allows different materials to be exposed by selective etching, as described in greater detail below.

The thicknesses of silicon dioxide layers 112, 116 and polysilicon layer 114 are selected to allow doping of substrate 102 to proceed through various modifications of barrier layer 110. Typically, first silicon dioxide layer 112 is between 100 Å, and 1000 Å thick, second silicon dioxide layer 116 is between 100 Å and 1000 Å thick, and polysilicon layer 114 is between 50 Å and 500 Å thick. In the preferred embodiment of the invention, the total thickness of barrier layer 110 is between 250 Å and 2500 Å thick.

Silicon dioxide layers 112, 116 may be formed by a variety of processes, including low pressure chemical vapor deposition (LPCVD) of silicon dioxide and oxidation of substrate 102 and polysilicon layer 114. LPCVD processes suitable for generating silicon dioxide layers 112, 116 are, for example, the reaction of silane with oxygen at 200° C. to 450° C. and the reaction of dichlorosilane with nitrous oxide at approximately 900° C. In the preferred embodiment, silicon dioxide layer 112 is grown by thermal oxidation (wet) of substrate 102 at 900° C. to 1000° C. and, silicon dioxide layer 116 is deposited by CVD.

Polysilicon layer 114 may also be formed by LPCVD. For example, the reaction of silane with hydrogen at approximately 600° C. to 650° C. and a pressure of between 25 and 150 Pa produces suitable polysilicon films for multilayer barrier 110.

Figure 1B:
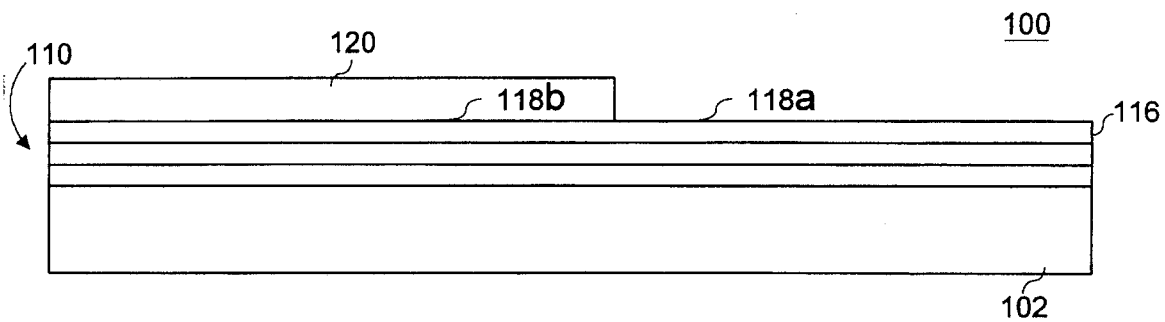

Once barrier 110 has been formed over substrate 102, semiconductor wafer 100 is masked for deposition of a set of wells of one conductivity type. Referring now to FIG. 1B, there is shown semiconductor wafer 100 following deposition of a photo-resist mask 120. For clarity, surface 118 of semiconductor wafer 100 has been designated as exposed surface 118a and masked surface 118b. Photo-resist 120 is deposited as a thin film, developed, and etched by any of a variety of well known methods. The thickness of photo-resist 120 is selected to mask the underlying areas of semiconductor wafer 100 against ion implantation. Typical thickness for photo-resist mask 120 is between 1 μm and 2 μm.

Figure 1C:
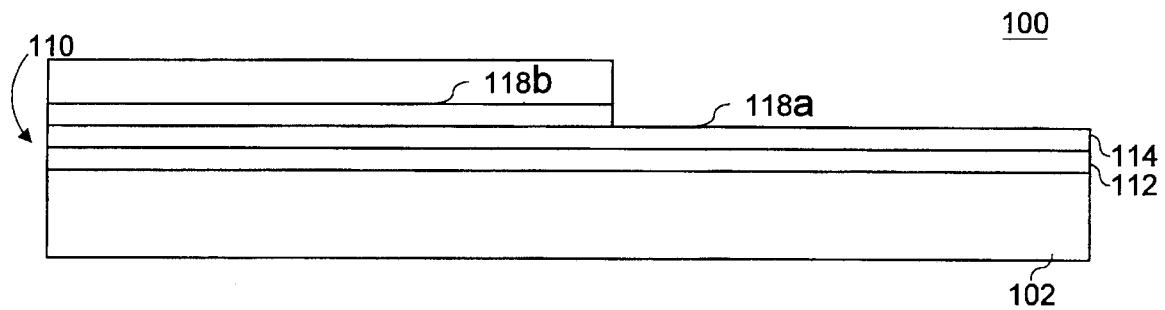

Prior to forming a first set of wells by ion implantation, oxide layer 116 of exposed surface 118a is etched. Referring now to FIG. 1C, there is shown a cross-section of semiconductor wafer 100 and photo-resist 120 following an etch step to remove the exposed portion of second silicon dioxide layer 116. Second silicon dioxide layer 116 may be chemically etched by, for example, a hydrofluoric acid containing etch, or it may be dry etched by plasma, sputter, or reactive ion etching techniques. Following this etch step, polysilicon 114 forms exposed surface 118a of semiconductor wafer 100. Photo-resist mask 120 insures that exposed surface 118a of polysilicon layer 114 is aligned with doped well 122.

Figure 1D:
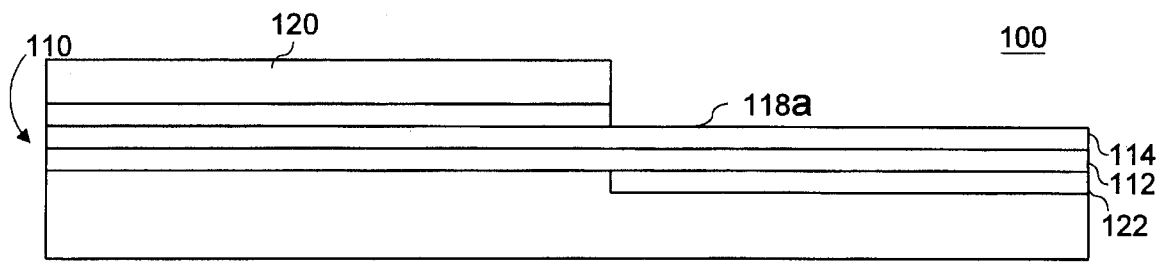

Referring now to FIG. 1D, there is shown a cross-section of semiconductor wafer 100 following ion implantation to form a doped well 122. In the preferred embodiment of the present invention, doped well 122 is a p-well formed by ion implantation of boron. Under selected implantation conditions, the lighter boron ions pass readily through polysilicon layer 114 and silicon dioxide layer 116. In the disclosed embodiment, the ions are deposited at energies of between about 100 and about 1000 keV at fluxes of between about $1 \times 10^{11}$ cm$^{-2}$ and about $1 \times 10^{13}$ cm$^{-2}$. It is understood that the cross-sections of FIGS. 1A–1I represent only one region of semiconductor wafer 100, and that multiple wells 122 can be formed on semiconductor 100, simultaneously.

Figure 1E:
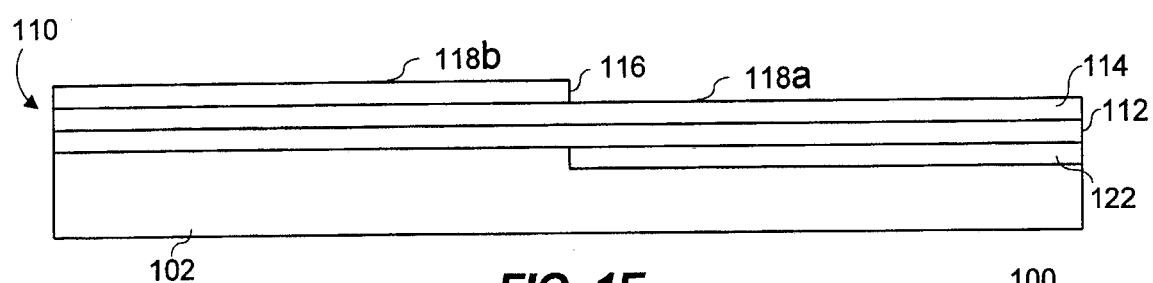

In preparation for forming a second set of doped well, photo-resist mask 120 is etched from semiconductor wafer 100. Referring now to FIG. 1E, there is shown a cross-section of semiconductor wafer 100 following removal of photo-resist mask 120. Photo-resist mask 120 may be removed by means of chemical solvents appropriate for the photo-resist material or by etching the photo-resist material in an oxygen plasma. FIG. 1E reveals semiconductor wafer 100 having exposed surface 118a formed by polysilicon layer 114 over doped wells 122 and previously masked surface 118b formed by silicon dioxide layer 116 over undoped regions of substrate 102.

In conventional self aligned well processes, following removal of photo-resist mask 120, a thick oxide layer is deposited over the first implanted well. As noted above, this requires a high temperature oxidation step, and the thickness of the resulting oxide layer disrupts the planarity the semiconductor wafer. The present invention uses the multi-layer structure of barrier layer 110 to alter exposed surface 118a of FIGS. 1B, 1C, 1D and preferentially deposit a non-oxide ion barrier over doped well 122. The method utilizes the different chemical and physical properties of polysilicon layer 114 and second silicon dioxide layer 116 in combination with selected deposition conditions to preferentially grow a germanium-silicon ion implantation barrier over polysilicon layer 114.

A Ge-containing alloy may be formed on semiconductor wafer 100 by a variety of methods. In the preferred embodiment, a germanium-silicon alloy is preferentially grown over polysilicon layer 114 using a CVD process in which a mixture of GeH$_4$ and SiH$_4$ are reacted in the presence of HCl at a substrate temperature of between about 500° C. and about 1000° C. The Ge:Si ratio in the deposited germanium-silicon alloy is generally between 20:80 and 50:50, although it may be 100% germanium. In the preferred embodiment, the Ge-containing layer is 30:70 Ge:Si and is deposited to a thickness of between about 0.4 and 1 μm approximately.

Figure 1F:
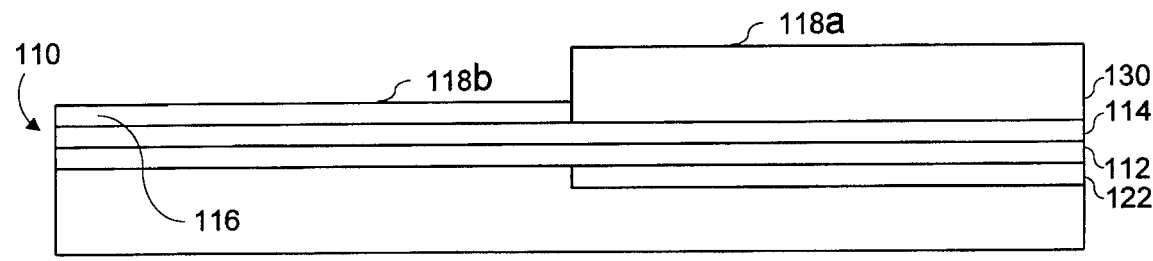

Referring now to FIG. 1F, there is shown semiconductor wafer 100 following exposure to a germanium-silicon mixture to produce a Ge—Si alloy layer 130. Under the disclosed conditions, Ge—Si alloy layer 130 does not deposit significantly on second silicon dioxide layer 116 and so preferentially forms on exposed polysilicon layer 114a over doped wells 122. Ge—Si alloy layer 130 acts as a mask during a subsequent ion implantation step and prevents doping ions from entering substrate 102 in the area of doped well 122. Thus, use of Ge—Si layer 130 eliminates the need for oxide layers and the accompanying high temperature oxide growth steps required to produce oxides.

Following deposition of Ge—Si alloy layer 130, oxide layer 116 and, usually, polysilicon layer 114 are etched from semiconductor wafer 100 in preparation for implanting doped wells of complementary conductivity type. For lighter, faster ions such a boron, polysilicon layer 114 need not be removed. However, boron ions are typically deposited in the first ion implantation step, and the heavier phosphorous or arsenic ions deposited in the second step will not penetrate polysilicon layer 114 and silicon dioxide layer 112 effectively. Consequently, the preferred embodiment of the present invention removes oxide layer 116 and polysilicon layer 114, and this is typically done by plasma etching.

Figure 1G:
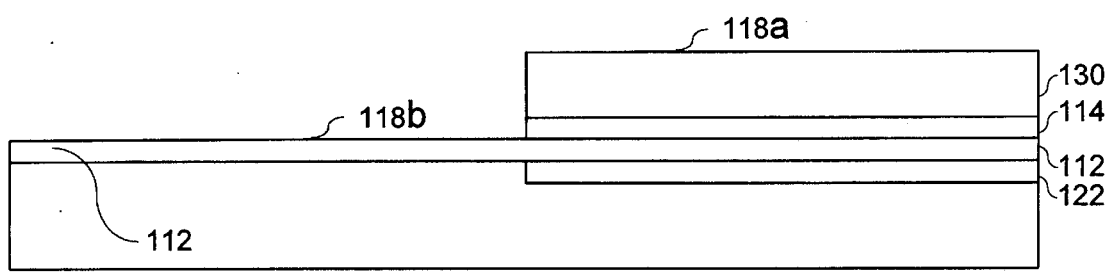

Referring now to FIG. 1G, there is shown a cross-section of semiconductor wafer 100 following the plasma etch step, where exposed surface 118b is formed by first SiO$_2$ layer 112. A subsequent ion implantation step forms the second set of complementary wells beneath exposed SiO$_2$ layer 112.

Figure 1H:
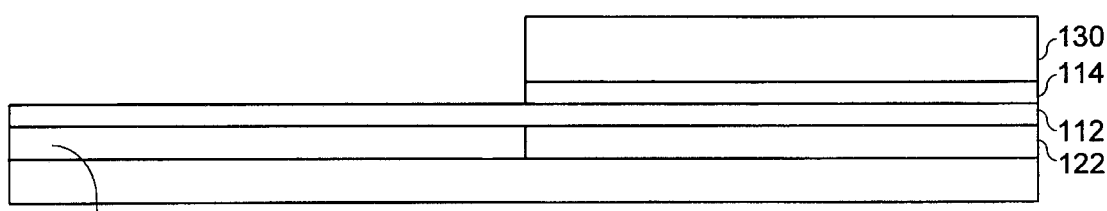
Figure 1I:
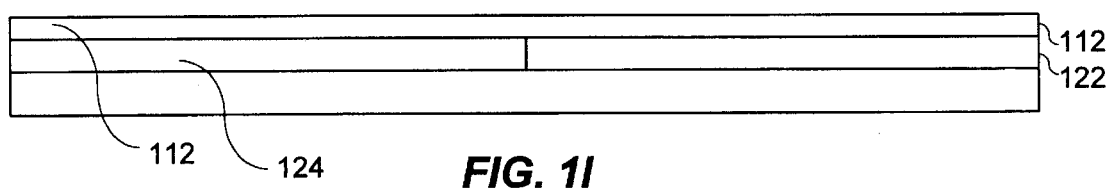
Figure 2:
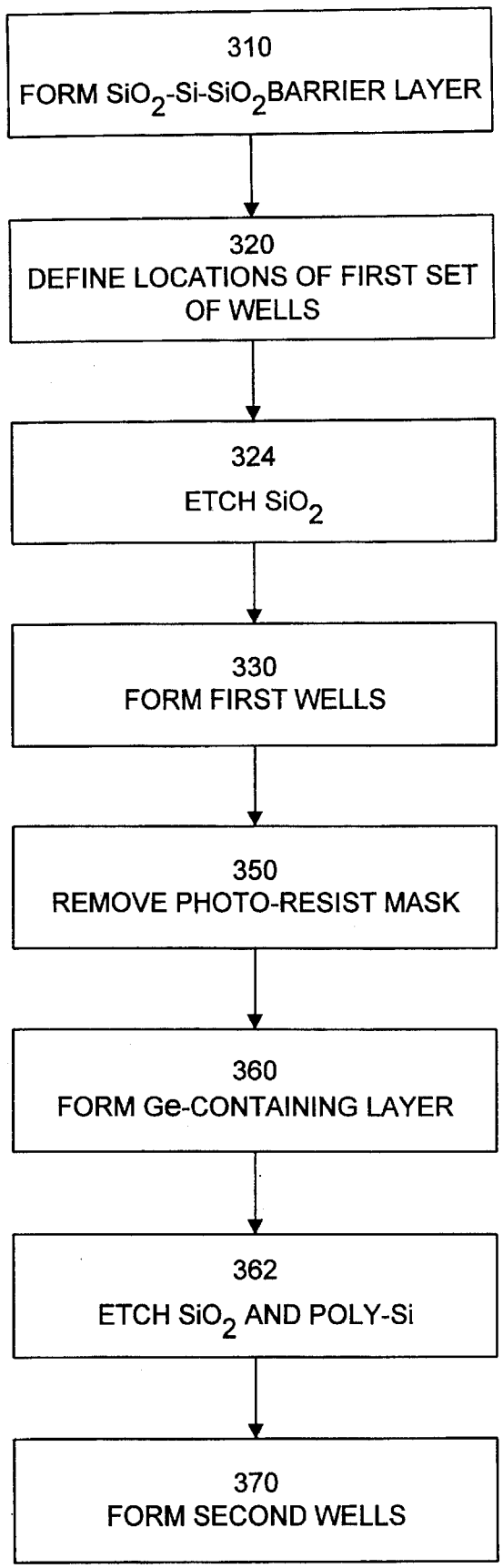
FIG. 2 is a flow chart representing the stages of the process shown in FIGS. 1A–1G.

Referring now to FIG. 1H, there is shown a cross-section of semiconductor wafer 100 following a second ion implantation step to form doped well 124. As in the first ion implantation step, the ions are deposited at energies of between about 100 and about 1000 keV at fluxes of between about $1 \times 10^{11}$ cm$^{-2}$ and about $1 \times 10^{13}$ cm$^{-2}$. Because the edges of doped wells 122, 124 are both determined by the location of original photo-resist 120, doped wells 122, 124 are self-aligned. Semiconductor wafer 100 can be prepared for further processing by etching Ge—Si alloy layer 130, remaining polysilicon layer 114, and, if desired, first SiO$_2$ layer 112, as shown in FIG. 1I. However, first silicon dioxide layer 112 provides a protective layer for wafer 100 and is usually left in place until it is necessary to remove it.

Referring now to FIG. 3, there is shown a flow chart summarizing the method of the present invention for producing self-aligned wells. A multilayer silicon dioxide-polysilicon-silicon dioxide barrier 110 is formed 310 on substrate 102 and masked 320 with a photo-resist layer 120 to define the locations of a first set of wells 122. Exposed silicon dioxide layer 116 is etched 324 to remove second SiO$_2$ layer 116 and expose polysilicon layer 114 at the selected locations. Dopant ions for wells 122 are then implanted 330 using standard ion implantation techniques, and photo-resist mask 120 is removed 350. Semiconductor wafer 100 is then exposed 360 to a Ge—Si mixture under conditions selected to form a Ge—Si alloy layer 130 preferentially over exposed polysilicon layer 114. Second SiO$_2$ layer 116 and polysilicon layer 114 exposed by removal of mask layer 120 are then etched 362, and dopant ions for second wells 124 are implanted 370 through the exposed portion of first SiO$_2$ layer 112. Ge—Si alloy layer 130 masks first wells 122 from ion implantation with second dopant.

Therefore, a method has been presented for producing self-aligned, double well structures using a single photo-resist masking step. The method utilizes a silicon-dioxide-polysilicon-silicon dioxide barrier layer that can be selectively etched to expose polysilicon or silicon dioxide layers, using the same photo-resist layer that defined a first set of wells. The chemical differences between these materials allow selective deposition of Ge-containing materials to form a second masking material over previously implanted first set of wells, and shields these wells from ion implantation by the second ion implantation process.

I claim:

1. A method for forming self-aligned, doped wells in a semiconductor structure, comprising the steps of:

forming a silicon dioxide-polysilicon-silicon dioxide barrier layer on a surface of a substrate to produce a modified substrate having an outer silicon dioxide layer;

etching the outer silicon dioxide layer of the modified substrate to expose the polysilicon of the barrier layer at first locations;

forming wells having a first conductivity type at the first locations;

exposing the modified substrate to a germanium-silicon mixture under conditions selected to deposit a germanium-silicon alloy layer selectively on the exposed polysilicon;

etching the outer silicon dioxide layer and polysilicon of the barrier layer on the modified substrate at locations adjacent to the deposited germanium-silicon alloy layer; and forming wells having a second conductivity type at the etched locations.

2. The method of claim 1, wherein the step of etching the outer silicon dioxide layer comprises the steps of:

masking the modified substrate to define first locations; and etching the outer silicon dioxide layer at the first locations.

3. The method of claim 2, wherein the step of exposing the modified substrate to a germanium-silicon mixture comprises the substeps of:

etching the substrate to remove any masking material;

heating the substrate to between about 500° C. and 1000° C.; and exposing the etched substrate to a germanium-silicon mixture in the presence of HCl.

4. The method of claim 3, wherein the step of forming wells of the second conductivity type comprises implanting the substrate with ions of a second dopant.

5. The method of claim 4, wherein the ion implantation step uses phosphorous ions.

6. The method of claim 1, wherein the step of forming wells having a first conductivity type comprises implanting the substrate with ions of a first dopant.

7. The method of claim 6, wherein the step of implanting ions of a first dopant comprises implanting boron ions.

8. The method of claim 1, wherein the outer silicon dioxide layer of the barrier layer is between about 100 and about 1000 Å thick and the polysilicon is between about 50 and 500 Å thick.

* * * * *